(12) United States Patent
Bakx

(10) Patent No.: US 6,753,733 B2
(45) Date of Patent: Jun. 22, 2004

(54) AMPLIFIER CIRCUIT AND METHOD FOR REDUCING STRAY FEEDBACK

(75) Inventor: Johannus Leopoldus Bakx, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 207 days.

(21) Appl. No.: 10/024,753

(22) Filed: Dec. 19, 2001

(65) Prior Publication Data

US 2002/0109551 A1 Aug. 15, 2002

(30) Foreign Application Priority Data

Dec. 22, 2000 (EP) ............................................. 00204802

(51) Int. Cl.[7] ................................................. H03F 1/14
(52) U.S. Cl. ..................................... 330/292; 330/260
(58) Field of Search .......................... 330/75, 260, 256, 330/270, 282, 291, 292, 308

(56) References Cited

U.S. PATENT DOCUMENTS

| 3,801,933 | A | | 4/1974 | Teare ............................ 330/35 |
|---|---|---|---|---|
| 4,720,686 | A | * | 1/1988 | Westwick ...................... 330/258 |
| 5,343,160 | A | | 8/1994 | Taylor ........................... 330/9 |
| 5,699,016 | A | * | 12/1997 | Federspiel et al. .......... 330/260 |
| 5,854,573 | A | * | 12/1998 | Chan ............................ 330/292 |
| 5,917,376 | A | * | 6/1999 | Ivanov et al. ................ 330/151 |
| 6,011,435 | A | * | 1/2000 | Takeyabu et al. ............ 330/252 |
| 6,160,450 | A | * | 12/2000 | Eschauzier et al. .......... 330/253 |
| 6,404,281 | B1 | * | 6/2002 | Kobayashi ................... 330/85 |
| 6,545,959 | B1 | * | 4/2003 | Iida ........................... 369/47.17 |
| 6,624,704 | B1 | * | 9/2003 | Varadarajan et al. ......... 330/311 |

FOREIGN PATENT DOCUMENTS

EP 0554743 A1 1/1993 ............. H03F/3/45

* cited by examiner

Primary Examiner—Michael Tokar
Assistant Examiner—Linh Van Nguyen
(74) Attorney, Agent, or Firm—Michael E. Belk

(57) ABSTRACT

The invention relates to an amplifier circuit (20) and a method for reducing stray feedback, wherein an additional feedback compensation terminal is provided at the output of the amplifier circuit. A predetermined fraction of the output signal of the amplifier circuit is output at the feedback compensation terminal (RFB) so as to reduce the stray feedback of the output signal. The feedback compensation terminal (RFB) enables a reduction of the stray feedback by providing an additional stray feedback signal which is negatively added at the input of the amplifier circuit (20) to thereby reduce overall stray feedback. The gain may be adjusted once during manufacturing, or each time when operation of the device is initiated. The amplifier circuit (20) may be a transimpedance amplifier for use in a read head of a reproducing device for a record carrier.

16 Claims, 2 Drawing Sheets

AMPLIFIER CIRCUIT AND METHOD FOR REDUCING STRAY FEEDBACK

Figure 1:
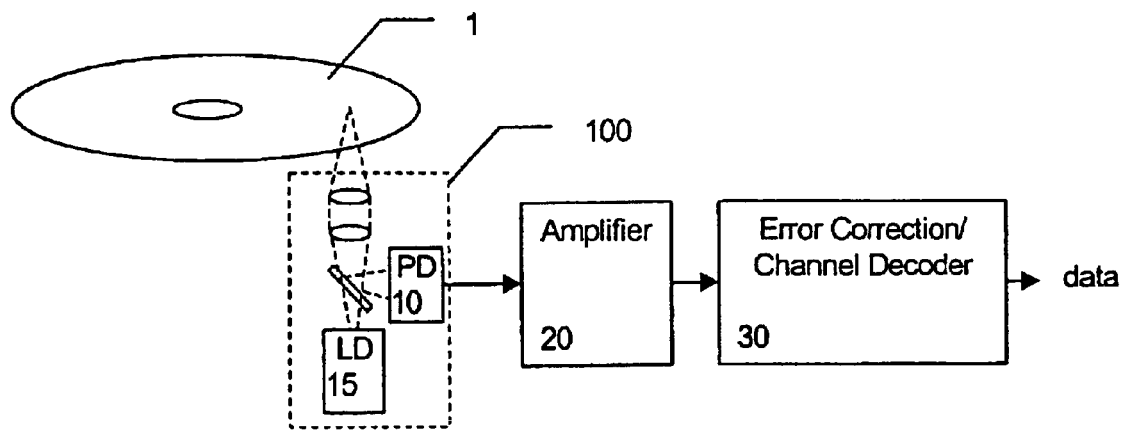

The present invention relates to an amplifier circuit as defined in the preamble of claim 1, and to a method for reducing stray feedback as defined in the preamble of claim 9. In particular, the present invention can be applied in a trans-impedance amplifier provided in a reproducing device for reproducing a record carrier such as an optical disc.

Transimpedance amplifiers are commonly used in instrumentation and communication applications to provide signal gain with minimal added noise, thus maintaining a high signal-to-noise ratio. The smaller the desired signal which is applied to the amplifier, the more critical it is that the signal-to-noise ratio is properly maintained.

In reproducing devices or players for optical record carriers, transimpedance amplifiers (TIA) are used for amplifying a photo diode current. The amplified signal is then coupled to a signal processor via a flexible cable or the like. Thereby, stray currents are induced at or coupled to the input of the TIA by stray feedback, e.g. capacitive feedback. This may cause an attenuation of high frequencies, or instabilities due to an additional phase shift. The amount of this stray feedback depends on the stray capacity between the output terminal and the input terminal, and the gain of the TIA. The stray capacity is determined by the wiring area, wherein the surface area of the output wiring is generally large due to the flexible cable. Furthermore, the wiring area of the input connections is large if discrete photo diodes are used. However, the wiring area of the input connections can be reduced if a PDIC (Photo Diode IC) is used, in which photo diodes are integrated with the TIA. The required gain or transimpedance $Z_T$ of the TIA is determined by the radiation power or light intensity used, the reflectivity and the modulation depth of the record carrier, and the efficiency of the radiation path.

The above problem plays a major role for record carriers having a low reflectivity, e.g. re-writable Compact Discs (CDRW) or re-writable Digital Versatile Discs (DVD+RW), and for non-polarizing radiation paths with low efficiency in both directions.

The allowed value of the stray capacity $C_s$ can be calculated by using the following equation:

$$f_{-3dB} = \frac{1}{2\pi \cdot Z_T \cdot C_S} \Rightarrow C_S = \frac{1}{2\pi \cdot Z_T \cdot f_{-3dB}} = \frac{1}{2\pi \cdot 10^5 \cdot 1.5 \cdot 10^8} F \approx 0,01 pF \quad (1)$$

wherein $Z_T$ denotes the required transimpedance (gain) of the transimpedance amplifier circuit in case a typical photo diode current $I_{PD}$ of 10 μA and a typical single-ended decoder voltage (output voltage of the transimpedance amplifier) of 1 $V_{pp}$ are assumed. $f_{-3dB}$ denotes the critical frequency (bandwidth) of the input signal in case of a DVD-ROM (Digital Versatile Disc Read-Only-Memory) player.

However, the thus obtained required value of the stray capacitance $C_s$ of 0,01 pF is unrealistically low. Realistic values have to be greater by a factor 10 to 30. A reduction of the transimpedance or gain would reduce capacitive feedback, but would cause a higher noise sensitivity. Moreover, an extra amplifier would be required at the end of the flexible cable to provide a sufficient signal level.

Figure 5:
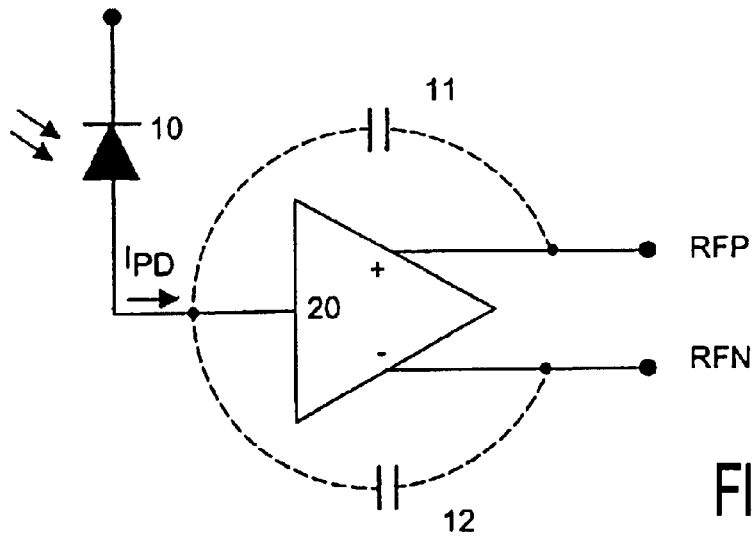

An attempt to solve the above problem is to use a differential output amplifier circuit as shown in FIG. 5. In FIG. 5, a transimpedance amplifier 20 is shown which comprises a differential output having an inverting output terminal (out of phase) RFN and a non-inverting output terminal (in phase) RFP. The inverting output terminal RFN presents signals 180 degrees out of phase with respect to the non-inverting output terminal RFP. The differential amplifier circuit 20 can be formed using either bipolar technology or FET technology.

Furthermore, stray capacities 11 and 12 are provided between the non-inverting output terminal RFP and the inverting output terminal RFN, respectively, such that respective feedback currents are fed back to the input terminal and added to the photo diode current $I_{PD}$. Due to the opposite phases of the respective feedback currents or signals, their values are subtracted at the input terminal of the transimpedance amplifier 20, whereby the resultant capacitive feedback is reduced.

However, as a result of asymmetries in the construction of the transimpedance amplifier 20, a netto stray capacitance remains, such that a certain level of stray feedback current remains at the input of the transimpedance amplifier 20.

It is an object of the present invention to provide an amplifier circuit and a method for further reducing the resultant stray feedback.

This object is achieved by an amplifier circuit as defined in claim 1, and by a method for reducing stray feedback as defined in claim 9.

Accordingly, the resultant capacity feedback is further reduced by the feedback compensation terminal as an additional output terminal for providing the predetermined fraction of the output signal which is adjusted in such a manner that the resultant stray feedback is minimized.

Preferably, the output terminal is a differential output terminal comprising a first and a second output terminal, and the output signal is a differential output signal. Thus, the differential output formed by the first and second output terminals already strongly reduces stray feedback interference, wherein the third feedback compensation terminal enables a further reduction of remaining asymmetries by properly adjusting the gain.

According to an advantageous development, an adjustable voltage dividing means may be provided for generating the fraction of the output signal.

The amplifier circuit may be a transimpedance amplifier and may be provided in a reproducing device having a reproducing element for generating the input signal. In particular, the reproducing device may me an optical disc player and the reproducing element may be a photo diode.

According to a further advantageous development, the value of the predetermined fraction may be updated during a start-up or operation initiation of a device in which the amplifier circuit is provided. Alternatively, the value of the predetermined fraction may be determined and adjusted when the amplifier circuit is manufactured or assembled.

The amplifier circuit may be provided in a reproducing device, such as an optical disk player, comprising a reproducing element for generating the input signal, channel decoding means and/or error correction means coupled to the output of the amplifier circuit.

Figure 2:
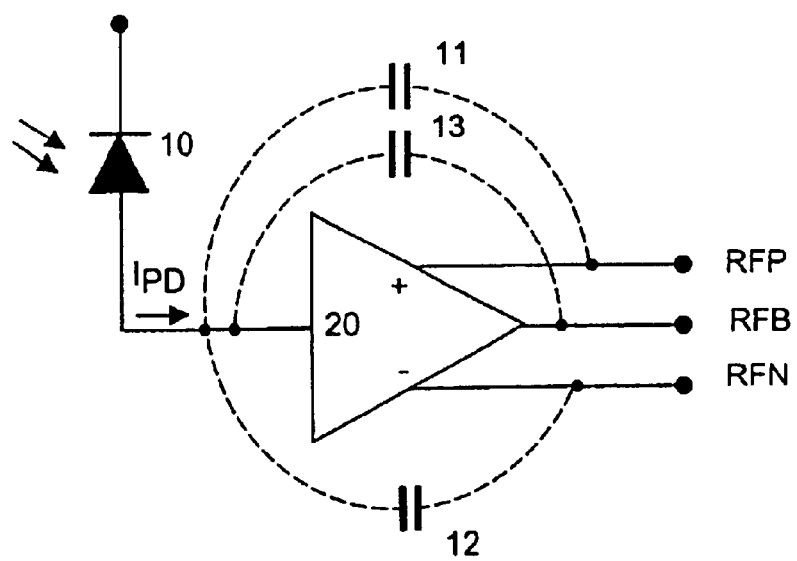
Figure 3:
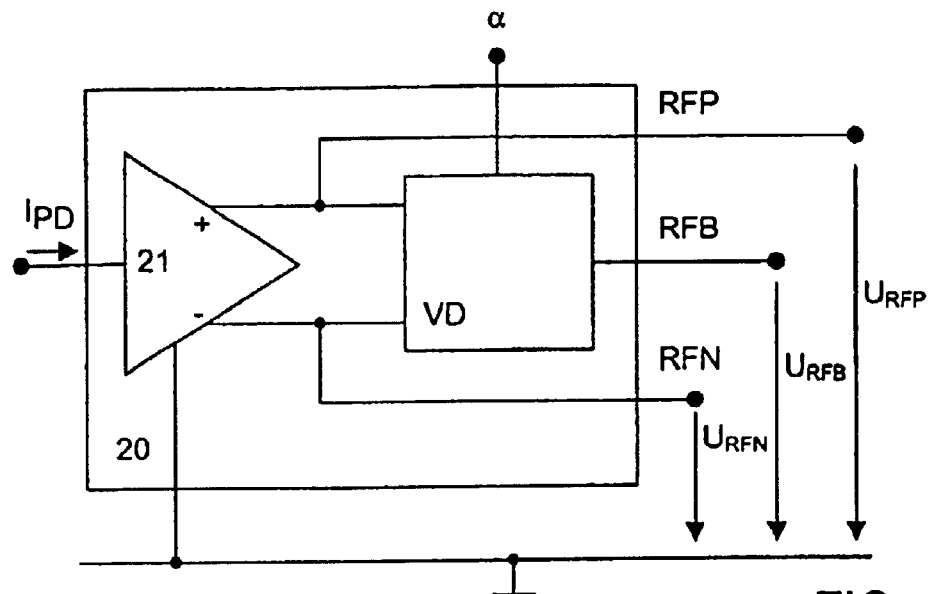
Figure 4:
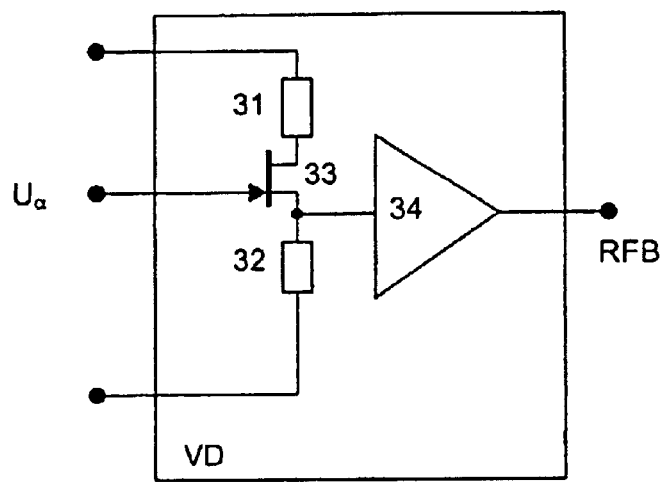

In the following, a preferred embodiment of the present invention will be described in greater detail with reference to the accompanying drawings, in which:

FIG. 1 shows a schematic diagram of an optical disk reproducing apparatus to which the present invention can be applied;

FIG. 2 shows a schematic diagram with a photo diode connected to a transimpedance amplifier according to preferred embodiment of the present invention, FIG. 3 shows a schematic diagram of the transimpedance amplifier according to the preferred embodiment of the present invention, FIG. 4 shows a schematic diagram of a voltage dividing circuit provided in the transimpedance amplifier according to the preferred embodiment of the present invention, and FIG. 5 shows a schematic diagram of a photo diode connected to a prior art trans-impedance amplifier.

The preferred embodiment will now be described based on an implementation in an optical disc reproducing device or optical disk player.

Referring to FIG. 1, the optical disk player comprises a reproducing element or optical pickup unit 100 for impinging a laser beam onto an optical disk 1 for reproducing the information therefrom. For this purpose, the optical pickup unit 100 includes a laser diode 15 for impinging the laser beam, optical means for focusing the laser beam on a recording track of the optical disk 1 and for obtaining a desirable position of the reflected laser beam from the optical disk 1, and a photo diode 10 for receiving the reflected laser beam so as to produce an electric signal indicative of the condition of the laser impinged recording track. An amplifier circuit such as a transimpedance amplifier 20 is connected to the optical pickup unit 100 to increase the amplitude of the signal obtained from the photo diode 10, and for producing a reproduction signal. This reproduction signal varies according to the lengths of the pits or marks formed in the recording track of the optical disk 100. An error correction and/or channel decoding circuit 30 is coupled to the output of the transimpedance amplifier 20 to receive, digitize and sample the reproduction signal. Furthermore, the sampled channel data is decoded by applying an error correction operation so as to produce decoded channel data.

FIG. 2 shows a schematic diagram of the transimpedance amplifier 20 connected to the photo diode 10 of the optical disc player. A photo current $I_{PD}$ is supplied to an input terminal of the transimpedance amplifier 20 which comprises a differential output at a non-inverting output terminal RFP and an inverting output terminal RFN. In addition thereto, a third output terminal, i.e. a feedback compensation terminal, RFB is provided for outputting a predetermined fraction or portion of the differential output signal.

Thus, in addition to the reduction of the capacitive or stray interference by the differential output, the third output RFB enables a further reduction of remaining asymmetries by properly adjusting the gain so as to obtain the predetermined fraction. The gain may be adjusted once during manufacturing, or each time when an operation of the device is initiated, i.e. during start-up of the player.

As can be gathered from FIG. 1, three feedback signals are coupled via respective stray capacities 11 to 13 to the input of the transimpedance amplifier 20, wherein the feedback signal from the third capacity 13 should compensate the resultant feedback signal due to the netto stray capacity of the first and second capacities 11 and 12. Thereby, the total or overall sum of feedback currents obtained from the first to third capacities 11 to 13 should be approximately zero at the input of the transimpedance amplifier 20.

FIG. 3 shows a schematic diagram of the transimpedance amplifier 20 which may comprise a transimpedance amplifier circuit 21 followed by a programmable voltage divider VD. The programmable voltage divider VD may comprise an external input for applying a control signal used to control the dividing ratio. In particular, the programmable voltage divider VD may be implemented by any voltage dividing circuitry or corresponding signal processing device which can be programmed or controlled by applying an external control signal, such as a control data or a control voltage.

As can be gathered from FIG. 3, the transimpedance amplifier 20 may be arranged to generate three output voltages $U_{RFN}$, $U_{RFB}$ and $U_{RFP}$ at its respective output terminals RFN, RFB, and RBP, respectively. The reference potential of these voltages may be the ground potential to which the transimpedance amplifier circuit 21 may also be connected.

Assuming that the capacity values of the stray capacities 11 to 13 are approximately equal, the output voltage $U_{RFB}$ at the feedback compensation terminal RFB can be calculated or determined on the basis of the following equation:

$$U_{RFB}=\alpha \cdot (U_{RFP}-U_{RFN}), \text{ wherein } -1<\alpha<+1 \qquad (2)$$

Thus, the predetermined fraction of the feedback compensation output is determined by the coefficient or parameter $\alpha$ which can be controlled by a corresponding input signal or data of the programmable voltage divider VD.

Alternatively, the feedback compensation output terminal RFB may be directly arranged at the transimpedance amplifier circuit 21, wherein an external programming input is provided at the transimpedance amplifier circuit 21 so as to control the gain according to the coefficient $\alpha$.

FIG. 4 shows a schematic diagram of a possible implementation example of the programmable voltage divider of FIG. 3. According to FIG. 4, the programmable voltage divider VD may comprise a voltage dividing branch consisting a first resistor 31, a transistor circuit or transistor 33 and a second resistor 32, wherein the voltage at the upper terminal of the second resistor 32 may be used as an input voltage for an operational amplifier 34 the output of which corresponds to the feedback compensation terminal RFB. The programming of the dividing ratio is then achieved by applying a corresponding voltage $U_\alpha$ to the transistor 33 so as to control the current flowing through the branch. In view of the fact that the upper input terminal corresponds to the non-inverting output terminal of the transimpedance amplifier circuit 21, and the lower input terminal corresponds to the inverting terminal of the transimpedance amplifier circuit 21, the current through the transistor 33 reflects the differential output signal of the transimpedance amplifier circuit 21. Thus, the gain at the feedback compensation terminal RFB can be adjusted by controlling the resistance of the transistor circuit or transistor 33 by a suitable voltage $U_\alpha$ at the control terminal thereof, so as to achieve a desired voltage dividing ratio.

However, it is obvious to the skilled person that any other implementation of the programmable voltage divider VD or any other programmable circuitry for determining the gain or transimpedance of the transimpedance amplifier 20 can be used in the preferred embodiment.

In the preferred embodiment, the third output or feedback compensation terminal leads to a further reduction of remaining asymmetries by properly adjusting the corresponding gain so as to achieve a required fraction of the differential output signal. The transimpedance amplifier may be used e.g. for amplifying diode signals in a read head of a reproducing device such as an optical disc player.

While the invention has been described with reference to the preferred embodiment it is to be understood that these are not limiting examples. Thus, various modifications may become apparent to those skilled in the art without departing from the scope of the present invention, as defined in the claims. In particular, the invention is not limited to a transimpedance amplifier used in the optical pickup unit 100 or any read head of a player for a CD or a DVD. The invention is applicable in any amplifier circuit having a stray feedback element, to thereby reduce feedback and corresponding interference.

What is claimed is:

1. An amplifier circuit for amplifying an input signal, comprising:
    a) an input terminal for inputting said input signal, and
    b) an output terminal (REP, RFN) for outputting an output signal corresponding to the amplified input signal, and
    c) a stray feedback element ($C_p$, $C_n$) by which said output signal is fed back to said input terminal,
characterized by
    d) a feedback compensation terminal (RFB) for outputting a predetermined fraction of said output signal so as to reduce the stray feedback of said output signal.

2. An amplifier circuit according to claim 1, characterized in that
    said output terminal is a differential output terminal comprising a first (REP) and a second (RFN) output terminal, and said output signal is a differential output signal.

3. An amplifier circuit according to claim 2, characterized in that
    said predetermined fraction is determined by the following equation:

$$U_{RFB} = \alpha(U_{RFP} - U_{RFN}); -1 < \alpha < 1$$

wherein the term ($U_{RFP} - U_{RFN}$) denotes the voltage value of said differential output signal, a denotes the value of said predetermined fraction, and $U_{RFB}$ denotes the voltage value of said predetermined fraction of said output signal.

4. An amplifier circuit according to claim 2, characterized in that said stray feedback element is a stray capacity (11, 12).

5. An amplifier circuit according to claim 2, characterized in that an adjustable voltage dividing means (VD) is provided for generating said fraction of said output signal.

6. An amplifier circuit according to claim 2, characterized in that said amplifier circuit is a transimpedance amplifier (20).

7. A reproducing device comprising an amplifier circuit (20) as claimed in claim 2, a reproducing element (10) for generating said input signal, channel decoding and/or error correction means (30) coupled to an output of said amplifier circuit (20).

8. A reproducing device according to claim 7, wherein said reproducing device is an optical disc player and said reproducing element is a photo diode (10).

9. A method of reducing stray feedback in an amplifier circuit (20), comprising the steps of:
    a) inputting an input signal into an input terminal; and
    b) outputting an output signal at an output terminal (RFP, RFN),
characterized by the steps of:
    c) providing a feedback compensation terminal (RFB) at said amplifier circuit; and
    d) generating a predetermined fraction of said differential output signal and supplying said predetermined fraction to said feedback compensation terminal (RFB) so as to reduce stray feedback of said output signal.

10. A method according to claim 9,
    characterized by determining and adjusting the value of said predetermined fraction when said amplifier circuit is manufactured.

11. A method according to claim 9,
    characterized by updating the value of said predetermined fraction during a start-up of a device in which said amplifier circuit is provided.

12. A method according to claim 9,
    characterized by generating said predetermined fraction by a voltage dividing operation.

13. A method according to claim 9, wherein the step of generating further comprises said predetermined fraction being determined by the following equation:

$$U_{RFB} = \alpha(U_{RFP} - U_{RFN}); -1 < \alpha < 1$$

wherein the term ($U_{RFP} - U_{RFN}$) denotes the voltage value of said differential output signal, a denotes the value of said predetermined fraction, and URFB denotes the voltage value of said predetermined fraction of said output signal.

14. A method according to claim 9, wherein the step of inputting further comprises inputting differential stray feedback signals from the output terminal (REP, RFN) to the input terminal and the step of providing further comprises providing a stray feed back signal from the feedback compensation terminal (REB) to the input terminal.

15. A method according to claim 14, wherein the step of providing further comprises providing the stray feedback signal to eliminate stray capacities within the differential feedback signal.

16. A method according to claim 9, wherein the step of generating further comprises generating the predetermined fraction further comprises controlling the predetermined fraction using either the input signal or a programmable voltage divider.

* * * * *